(12) United States Patent
Gauthier, Jr. et al.

(10) Patent No.: US 9,704,852 B2
(45) Date of Patent: Jul. 11, 2017

(54) ELECTROSTATIC DISCHARGE AND PASSIVE STRUCTURES INTEGRATED IN A VERTICAL GATE FIN-TYPE FIELD EFFECT DIODE

(71) Applicant: GLOBALFOUNDRIES INC., Grand Cayman (KY)

(72) Inventors: Robert J. Gauthier, Jr., Hinesburg, VT (US); Tom C. Lee, Essex Junction, VT (US); You Li, Essex Junction, VT (US); Rahul Mishra, Essex Junction, VT (US); Souvick Mitra, Essex Junction, VT (US); Andreas Scholze, Colchester, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/140,516

(22) Filed: Apr. 28, 2016

(65) Prior Publication Data
US 2016/0379972 A1    Dec. 29, 2016

Related U.S. Application Data

(62) Division of application No. 14/753,628, filed on Jun. 29, 2015, now Pat. No. 9,391,065.

(51) Int. Cl.
*H01L 29/66* (2006.01)
*H01L 29/15* (2006.01)
(Continued)

(52) U.S. Cl.
CPC ........ *H01L 27/0288* (2013.01); *H01L 27/027* (2013.01); *H01L 27/0266* (2013.01);
(Continued)

(58) Field of Classification Search
CPC ............ H01L 27/0288; H01L 29/0649; H01L 29/0684; H01L 29/42372; H01L 29/7827
(Continued)

(56) References Cited

U.S. PATENT DOCUMENTS

| | | |
|---|---|---|
| 6,949,768 B1 | 9/2005 | Anderson et al. |
| 7,060,539 B2 | 6/2006 | Chidambarrao et al. |

(Continued)

FOREIGN PATENT DOCUMENTS

| | | |
|---|---|---|
| EP | 2273554 A1 | 1/2011 |
| KR | 1020050041704 A | 5/2005 |
| WO | 2013006989 A1 | 1/2013 |

OTHER PUBLICATIONS

U.S. Appl. No. 14/753,628, Restriction Requirement dated Jan. 14, 2016, 7 pages.

(Continued)

*Primary Examiner* — Dzung Tran
(74) *Attorney, Agent, or Firm* — Gibb & Riley, LLC; Michael J. LeStrange, Esq.

(57) ABSTRACT

Field effect diode structures utilize a junction structure that has an L-shape in cross-section (a fin extending from a planar portion). An anode is positioned at the top surface of the fin, and a cathode is positioned at the end surface of the planar portion. The perpendicularity of the fin and the planar portion cause the anode and cathode to be perpendicular to one another. A first gate insulator contacts the fin between the top surface and the planar portion. A first gate conductor contacts the first gate insulator, and the first gate insulator is between the first gate conductor and the surface of the fin. Additionally, a second gate insulator contacts the planar portion between the end surface and the fin. A second gate (Continued)

conductor contacts the second gate insulator, and the second gate insulator is between the second gate conductor and the surface of the planar portion.

14 Claims, 11 Drawing Sheets

(51) Int. Cl.
| | | |
|---|---|---|
| *H01L 27/088* | (2006.01) | |
| *H01L 27/02* | (2006.01) | |
| *H01L 27/06* | (2006.01) | |
| *H01L 29/78* | (2006.01) | |
| *H01L 29/06* | (2006.01) | |
| *H01L 29/423* | (2006.01) | |

(52) U.S. Cl.
CPC ...... *H01L 27/0629* (2013.01); *H01L 29/0649* (2013.01); *H01L 29/0684* (2013.01); *H01L 29/42372* (2013.01); *H01L 29/7827* (2013.01); *H01L 29/7855* (2013.01); *H01L 29/785* (2013.01); *H01L 2029/7858* (2013.01)

(58) Field of Classification Search
USPC .................................. 257/328, 77, 368, 401
See application file for complete search history.

(56) References Cited

U.S. PATENT DOCUMENTS

| 7,180,134 | B2 | 2/2007 | Yang et al. |
|---|---|---|---|
| 7,397,089 | B2 | 7/2008 | Zhang et al. |
| 8,643,066 | B2 | 2/2014 | Min et al. |
| 8,785,968 | B2 | 7/2014 | Shrivastava et al. |
| 2005/0191795 | A1 | 9/2005 | Chidambarrao et al. |
| 2006/0084212 | A1 | 4/2006 | Anderson et al. |
| 2007/0076477 | A1 | 4/2007 | Hwang et al. |
| 2007/0262386 | A1 | 11/2007 | Gossner et al. |
| 2008/0067587 | A1 | 3/2008 | Gossner et al. |
| 2008/0121983 | A1 | 5/2008 | Seong et al. |
| 2008/0265343 | A1 | 10/2008 | Greene et al. |
| 2011/0278676 | A1* | 11/2011 | Cheng ............ H01L 21/823807 257/369 |
| 2011/0291196 | A1* | 12/2011 | Wei ........................ H01L 29/785 257/365 |
| 2012/0091538 | A1* | 4/2012 | Lin ................... H01L 29/66795 257/401 |
| 2012/0256238 | A1* | 10/2012 | Ning ...................... H01L 21/84 257/280 |
| 2014/0103414 | A1* | 4/2014 | Koldiaev .............. H01L 21/845 257/296 |
| 2014/0239399 | A1* | 8/2014 | Nagumo ............... H01L 29/785 257/347 |
| 2014/0291766 | A1 | 10/2014 | Hafez et al. |
| 2015/0054027 | A1 | 2/2015 | Clark, Jr. et al. |

OTHER PUBLICATIONS

U.S. Appl. No. 14/753,628, Notice of Allowance dated Apr. 12, 2016, 10 pages.

* cited by examiner

ELECTROSTATIC DISCHARGE AND PASSIVE STRUCTURES INTEGRATED IN A VERTICAL GATE FIN-TYPE FIELD EFFECT DIODE

CROSS-REFERENCE TO RELATED APPLICATIONS

The present invention claims the benefit under 35 U.S.C. §120 as a divisional of presently pending U.S. patent application Ser. No. 14/753,628 filed on Jun. 29, 2015, the entire teachings of which are incorporated herein by reference.

BACKGROUND

The present disclosure generally relates to diodes, and more specifically, to vertical diodes in Fin-type integrated circuit structures.

Fin-type field effect transistors (FinFETs) utilize a fin-shaped semiconductor body as the main transistor element. The center (channel) of the fin is a semiconductor and the ends of the fin are conductors, while an overlying gate supplies a voltage field to alter the conductivity of the fin center.

Diodes comprise a p-n junction that allows current to flow in a specified direction between an anode and a cathode. There are many types of diodes; however, diodes in general require an initial threshold to be exceeded before current can pass. Some diodes can be controlled with one or more gates to determine how easily the current can pass through the diode.

However, diodes are not readily amenable to fin structures because, rather than transistors that have a single channel with conductive source and drain structures that can be readily doped with impurities once the overlying gate or gate oxide is formed over the fin structure, diodes utilize multiple closely spaced impurities that are not easily aligned (especially in dual gate field effect diodes). Therefore, diodes are not readily formed using fin-type transistor structures.

SUMMARY

Exemplary embodiments of field effect diode structures herein utilize a junction structure that has an L-shape in cross-section. The junction structure comprises a planar portion and a fin portion. More specifically, the fin portion extends from the planar portion (in a first direction). The planar portion extends in a second direction perpendicular to the first direction. The fin portion has a top surface distal to the planar portion in the first direction. The top surface is co-planar with the planar portion, but the top surface lies in a different plane from the planar portion. The planar portion has an end surface distal to the fin portion in the second direction. The end surface is co-planar with the fin portion, but the end surface lies in a different plane from the fin portion. An anode is positioned at the top surface of the fin portion, and a cathode is positioned at the end surface of the planar portion. The perpendicularity of the fin portion and the planar portion cause the anode and cathode to be perpendicular to one another.

A first gate insulator contacts a surface of the fin portion that extends in the first direction. Specifically, the first gate insulator contacts the surface of the fin portion between the top surface and the planar portion. A first gate conductor contacts the first gate insulator, and the first gate insulator is positioned between the first gate conductor and the surface of the fin portion. The first gate conductor can comprise a wrap-around gate conductor that surrounds all four sides of the rectangular fin portion that extend in the first direction. Again, the first gate insulator is between the four sides of the rectangular fin portion and the wrap-around gate conductor.

Additionally, a second gate insulator contacts a surface of the planar portion that extends in the second direction. The second gate insulator contacts the surface of the planar portion between the end surface and the fin portion. A second gate conductor contacts the second gate insulator, and the second gate insulator is positioned between the second gate conductor and the surface of the planar portion. In this way, the second gate conductor comprises an electrostatic discharge protection device.

Because of the multiple gates, the junction structure comprises a plurality of p-n junctions between the anode and the cathode. For example, the junction structure comprises a first temporary p-n junction between the anode and the first gate conductor, a second temporary p-n junction between the fin portion and the second gate conductor, and a third permanent p-n junction between the cathode and the second gate conductor.

In some structures, the junction structure comprises a semiconductor. The anode comprises a conductor that has a first type impurity and the cathode comprises a conductor that has a second type impurity (where the first type impurity has an opposite polarity from the second type impurity). Thus, the junction structure comprises a conductor between the anode and the cathode based on a voltage difference between the first gate conductor and the second gate conductor.

Additional field effect diode structure embodiments herein comprise a junction structure that also has an L-shape in cross-section, where the junction structure comprises a planar portion and a fin portion. Again, the fin portion extends in a first direction from the planar portion, and the planar portion extends in a second direction perpendicular to the first direction. The fin portion has a top surface distal to the planar portion in the first direction, where the top surface is co-planar with the planar portion. The top surface lies in a different plane from the planar portion. The planar portion has an end surface distal to the fin portion in the second direction. The end surface is co-planar with the fin portion, and the end surface lies in a different plane from the fin portion.

Similarly, an anode is positioned at the top surface of the fin portion, and a cathode is positioned at the end surface of the planar portion. A first gate insulator contacts a surface of the fin portion that extends in the first direction. Specifically, the first gate insulator contacts the surface of the fin portion between the top surface and the planar portion. A first gate conductor contacts the first gate insulator. The first gate insulator is positioned between the first gate conductor and the surface of the fin portion. A second gate insulator contacts a surface of the planar portion that extends in the second direction. The second gate insulator contacts the surface of the planar portion between the end surface and the fin portion. A ballast resistor contacts the second gate insulator, and the second gate insulator is positioned between the ballast resistor and the surface of the planar portion.

Other field effect diode structure embodiments herein comprise a polysilicon junction structure on the vertical portion of the L-shaped fin. As with the previously discussed structures, the L-shaped fin comprises a planar portion and a fin portion. The fin portion again extends in a first direction from the planar portion, and the planar portion extends in a second direction perpendicular to the first direction. The fin portion has a top surface distal to the planar portion in the first direction. The top surface is co-planar with the planar portion, but the top surface lies in a different plane from the planar portion. The planar portion has an end surface distal to the fin portion in the second direction. The end surface is co-planar with the fin portion, but the end surface lies in a different plane from the fin portion. An anode is positioned at the top surface of the fin portion, and a cathode is positioned at the end surface of the planar portion. A gate insulator contacts a surface of the fin portion that extends in the first direction. The gate insulator contacts the surface of the fin portion between the top surface and the planar portion. A gate conductor contacts the gate insulator, and the gate insulator is positioned between the gate conductor and the surface of the fin portion.

BRIEF DESCRIPTION OF THE DRAWINGS

The embodiments herein will be better understood from the following detailed description with reference to the drawings, which are not necessarily drawn to scale and in which.

DETAILED DESCRIPTION

As noted above, diodes are not readily formed using fin-type transistor structures. Therefore, this disclosure presents a gated diode in a fin-shaped structure; however, rather than attempting the difficult task of forming multiple, closely-spaced implants and gates within the fin, this disclosure uses a vertical fin structure (sometimes referred to herein as an L-shaped fin structure) and forms the anode on the top of the fin and the cathode at the end of the planar structure that is perpendicular to the fin. This allows the fin-type field effect diode (FinFED) to have one or two gates and allows impurities and gates to be more easily formed and aligned within the cathode and anode regions. Further, the multiple gates of the diodes here can be made differently (e.g., one gate can be a ballast gate) to allow additional electrostatic discharge performance gains.

Figure 1:
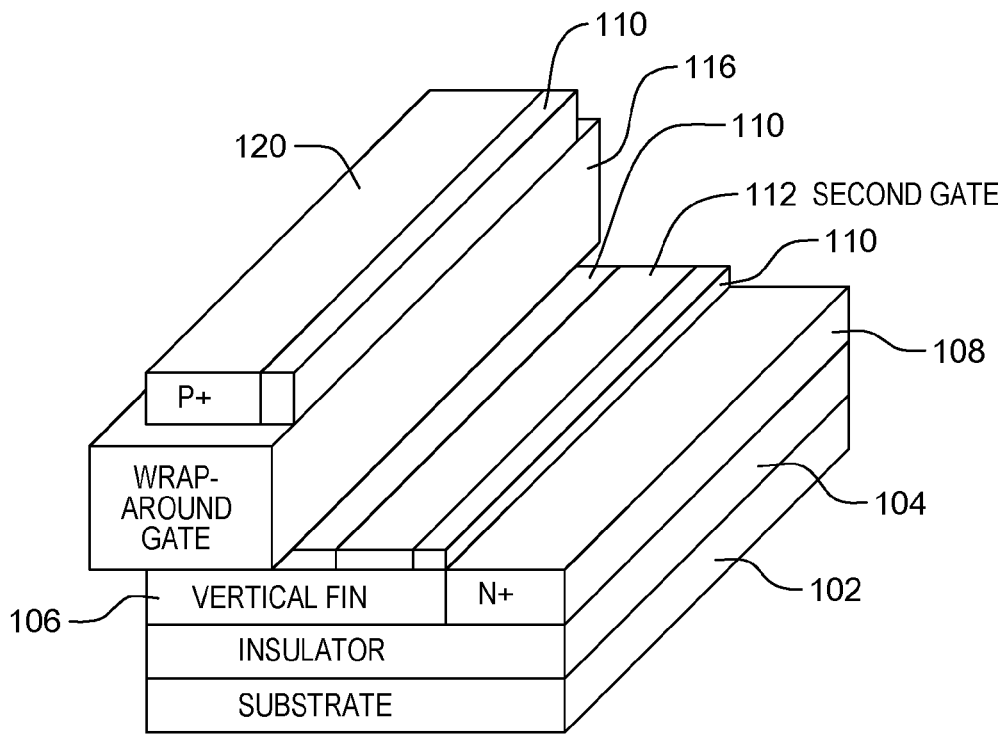
FIG. 1 is a schematic diagram illustrating a field effect diode in perspective view.
Figure 2:
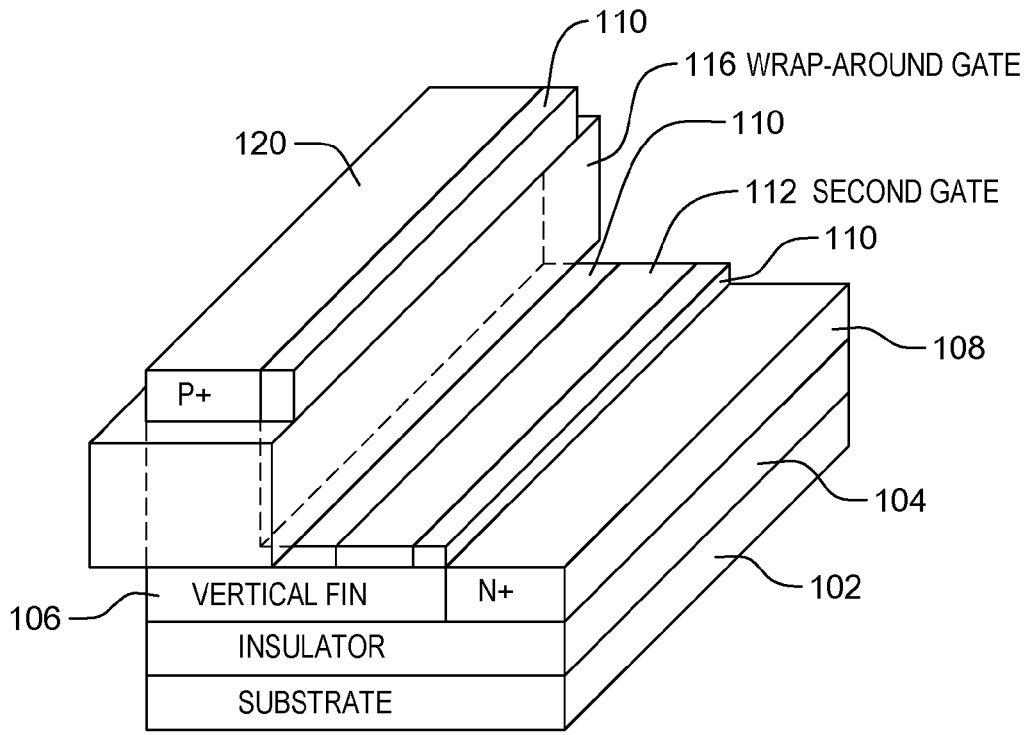
FIG. 2 is a schematic diagram illustrating the field effect diode, shown in FIG. 1, in perspective view showing the wrap-around gate in transparent view.
Figure 3:
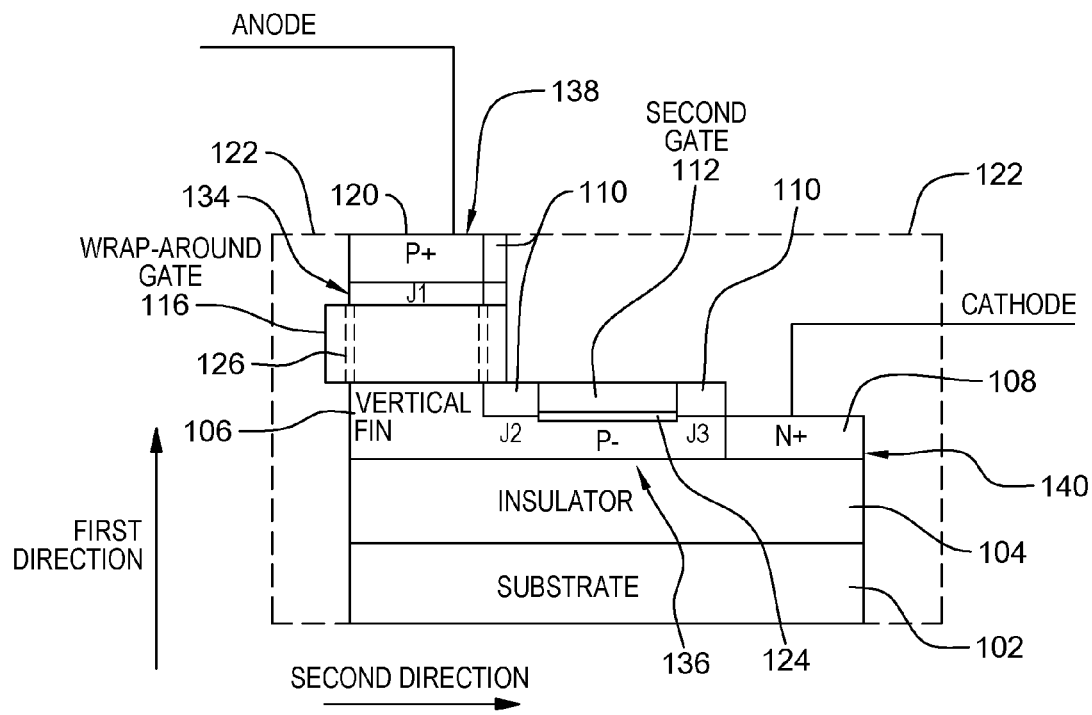
FIG. 3 is a schematic diagram illustrating a field effect diode, shown in FIG. 1, in cross-sectional view.
Figure 4:
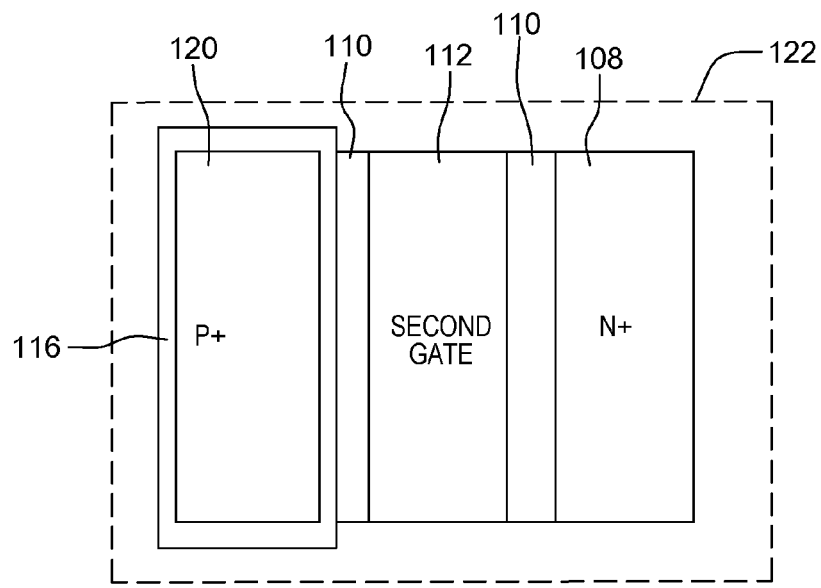
FIG. 4 is a schematic diagram illustrating a field effect diode, shown in FIG. 1, in plan or top-down view.

Thus, exemplary field effect diode structures herein utilize a junction structure that has an L-shape in cross-section. FIG. 1 is a schematic diagram illustrating a field effect diode in perspective view. FIG. 2 is a schematic diagram illustrating the field effect diode, shown in FIG. 1, in perspective view showing the wrap-around gate in transparent view. FIG. 3 is a schematic diagram illustrating a field effect diode, shown in FIG. 1, in cross-sectional view. FIG. 4 is a schematic diagram illustrating a field effect diode, shown in FIG. 1, in plan or top-down view. In the drawings herein, the same identification numbers represent the same or similar structures. For example, as shown in FIGS. 1-4, a semiconductor junction structure 106 comprises a planar portion 136 and a fin portion 134.

While not shown in all drawings to avoid unnecessary clutter, as would be understood by those ordinarily skilled in the art, various portions of the L-shaped fin 106 (or the entire L-shaped fin) can be selectively doped to comprise one or more semiconductor well regions (e.g., N or P regions) of the transistor structure, of which the L-shaped fin 106 is a part. For purposes herein, a "semiconductor" is a material or structure that may include an implanted or in-situ impurity that allows the material to sometimes be a conductor and sometimes be an insulator, based on electron and hole carrier concentration. As used herein, "implantation processes" can take any appropriate form (whether now known or developed in the future) and can comprise, for example, ion implantation, etc. In a gated diode, the semiconductor region can create multiple p-n junctions between the anode and cathode, as controlled by the electrical fields created by the gates.

More specifically, the fin portion 134 extends from the planar portion 136 (in a first direction). The planar portion 136 extends in a second direction perpendicular to the first direction. The fin portion 134 has a top surface 138 distal to the planar portion 136 in the first direction. The top surface 138 is co-planar with the planar portion 136, but the top surface 138 lies in a different plane from the planar portion 136. The planar portion 136 has an end surface 140 distal to the fin portion 134 in the second direction. The end surface 140 is co-planar with the fin portion 134, but the end surface 140 lies in a different plane from the fin portion 134.

A conductive anode 120 (e.g., having a P+ doping polarity/concentration) is positioned at the top surface 138 of the fin portion 134, and a conductive cathode 108 (e.g., having an N+ doping polarity/concentration) is positioned at the end surface 140 of the planar portion 136. The perpendicularity of the fin portion 134 and the planar portion 136 causes the anode 120 and cathode 108 to be perpendicular to one another.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

A first gate insulator (e.g., oxide) 126 contacts (is directly on) the planar surface of the fin portion 134 that extends in the first direction. Specifically, the first gate insulator 126 contacts the surface of the fin portion 134 between the top surface 138 and the planar portion 136. A first gate conductor 116 contacts (is directly on) the first gate insulator 126, and the first gate insulator 126 is positioned between the first gate conductor 116 and the surface of the fin portion 134. The first gate conductor 116 can comprise a wrap-around gate conductor that surrounds all four sides of the rectangular fin portion 134 that extend in the first direction, or a single planar conductive gate strip. Again, the first gate insulator 126 is between the four sides of the rectangular fin portion 134 and the wrap-around gate conductor.

Additionally, a second gate insulator (e.g., oxide) 124 contacts (is directly on) a surface of the planar portion 136 that extends in the second direction. Specifically, the second gate insulator 124 contacts the surface of the planar portion 136 between the end surface 140 and the fin portion 134. A second gate conductor 112 contacts (is directly on) the second gate insulator 124, and the second gate insulator 124 is positioned between the second gate conductor 112 and the surface of the planar portion 136. Item 122 represents adjacent different structures and/or an insulator that isolates the diode from adjacent structures. As is understood by those ordinarily skilled in the art, various contacts and other structures can be formed through the insulator 122 to make contact with different components of the illustrated diodes.

Thus, as shown above, the second gate conductor 112 comprises an electrostatic discharge protection device. Because of the multiple gates 112, 116, the junction structure 106 comprises a plurality of p-n junctions between the anode 120 and the cathode 108. For example, depending on the voltage of the gates, the junction structure 106 comprises a first temporary p-n junction J1 between the anode 120 and the first gate conductor 116, a second temporary p-n junction J2 between the fin portion 134 and the second gate conductor 112, and a third permanent p-n junction J3 between the cathode 108 and the second gate conductor 112. The voltage in the gates can completely turn the diode off, can form a p-n junction, can form a p-n-p-n junction, etc., as is understood by those ordinarily skilled in the art.

In the structures described above, the junction structure 106 comprises a semiconductor. The anode 120 comprises a conductor that has a first type impurity and the cathode 108 comprises a conductor that has a second type impurity (where the first type impurity has an opposite polarity from the second type impurity). Thus, the junction structure 106 comprises a conductor between the anode 120 and the cathode 108 based on a voltage difference between the first gate conductor 116 and the second gate conductor 112.

Figure 5:
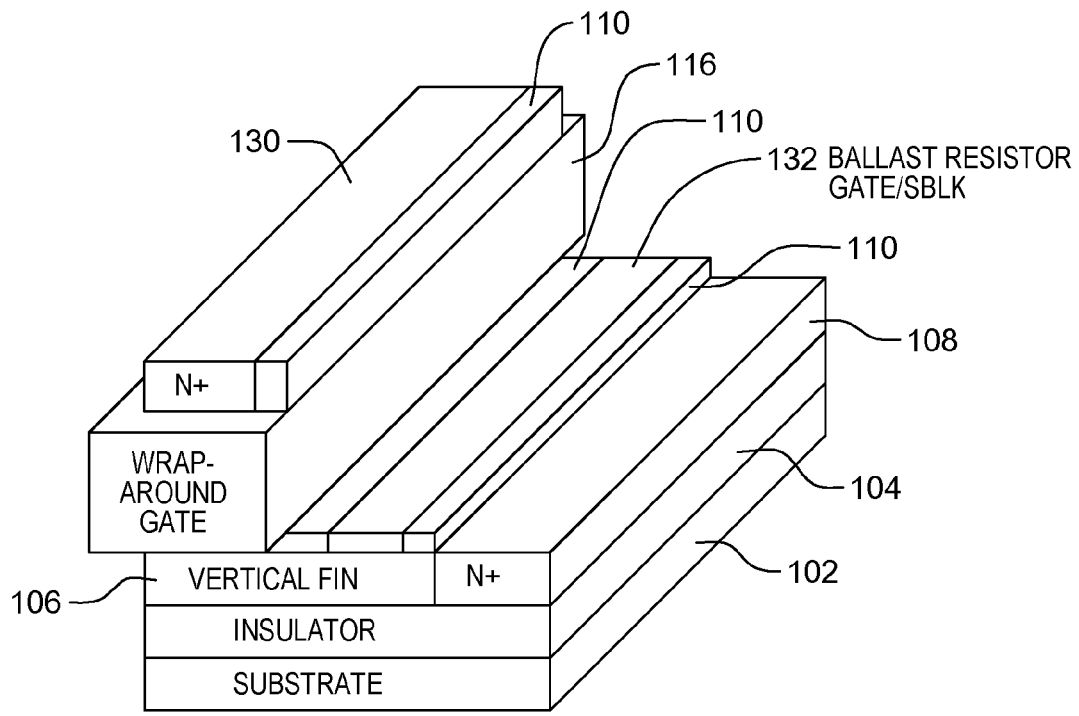
FIG. 5 is a schematic diagram illustrating a field effect diode in perspective view.
Figure 6:
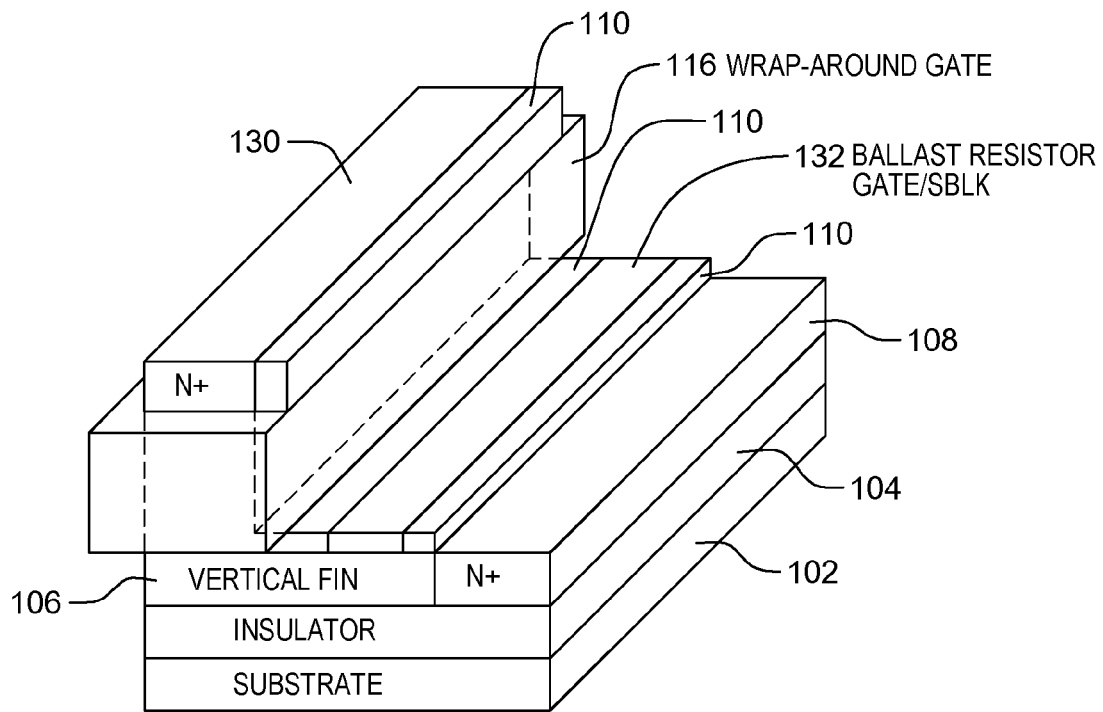
FIG. 6 is a schematic diagram illustrating the field effect diode, shown in FIG. 5, in perspective view showing the wrap-around gate in transparent view.
Figure 7:
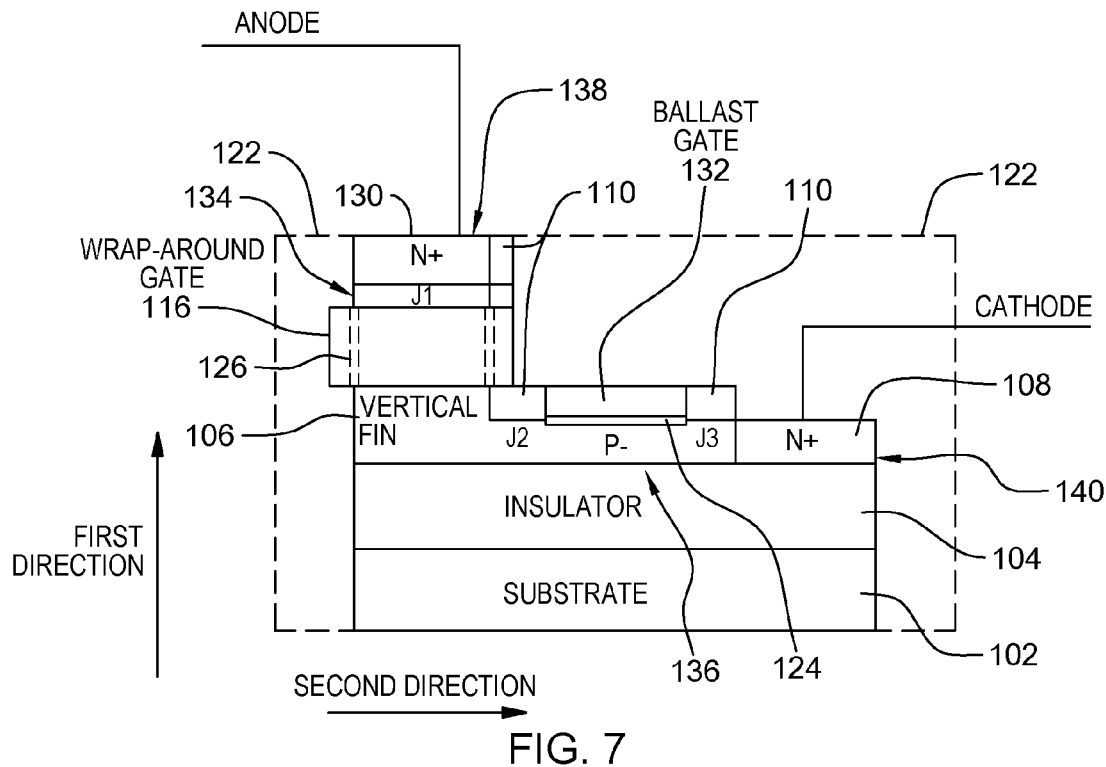
FIG. 7 is a schematic diagram illustrating a field effect diode, shown in FIG. 5, in cross-sectional view.
Figure 8:
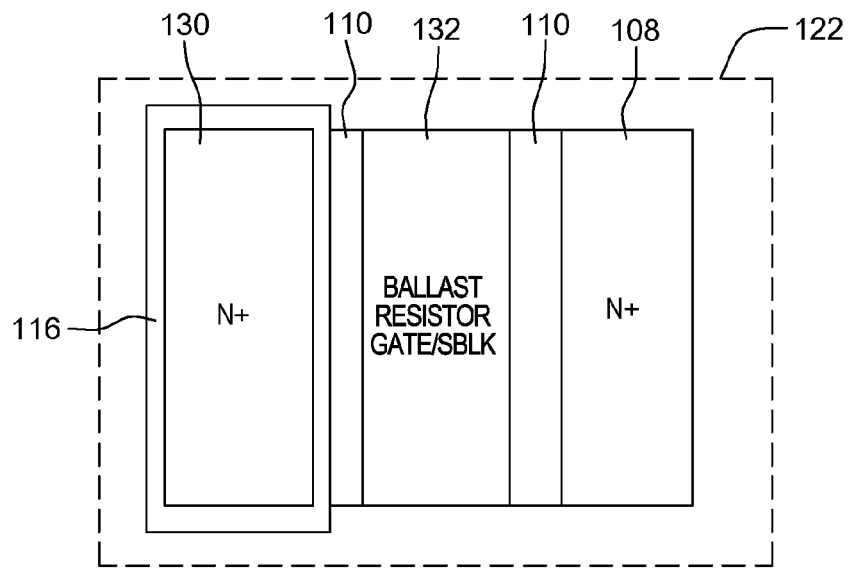
FIG. 8 is a schematic diagram illustrating a field effect diode, shown in FIG. 5, in plan or top-down view.

Additional field effect diode structures are shown in FIGS. 5-8. Specifically, FIG. 5 is a schematic diagram illustrating a field effect diode in perspective view. FIG. 6 is a schematic diagram illustrating the field effect diode, shown in FIG. 5, in perspective view showing the wrap-around gate in transparent view. FIG. 7 is a schematic diagram illustrating a field effect diode, shown in FIG. 5, in cross-sectional view. FIG. 8 is a schematic diagram illustrating a field effect diode, shown in FIG. 5, in plan or top-down view.

As shown in FIGS. 5-8 additional structures herein comprise fin-type field effect diodes that include a ballast resistor. More specifically, the structure in FIGS. 5-8 includes a junction structure 106 that also has an L-shape in cross-section, where the junction structure comprises a planar portion 136 and a fin portion 134. Again, the fin portion 134 extends in a first direction from the planar portion 136, and the planar portion 136 extends in a second direction perpendicular to the first direction. The fin portion 134 has a top surface 138 distal to the planar portion 136 in the first direction, where the top surface 138 is co-planar with the planar portion 136. The top surface 138 lies in a different plane from the planar portion 136. The planar portion 136 has an end surface 140 distal to the fin portion 134 in the second direction. The end surface 140 is co-planar with the fin portion 134, and the end surface 140 lies in a different plane from the fin portion 134.

Similarly, an anode 130 (e.g., having an N+ doping polarity/concentration) is positioned at the top surface 138 of the fin portion 134, and a cathode 108 is positioned at the end surface 140 of the planar portion 136. A first gate insulator 126 contacts a surface of the fin portion 134 that extends in the first direction. Specifically, the first gate insulator 126 contacts the surface of the fin portion 134 between the top surface 138 and the planar portion 136. A first gate conductor 116 contacts the first gate insulator 126. The first gate insulator 126 is positioned between the first gate conductor 116 and the surface of the fin portion 134. A second gate insulator 124 contacts a surface of the planar portion 136 that extends in the second direction. The second gate insulator 124 contacts the surface of the planar portion 136 between the end surface 140 and the fin portion 134. A ballast resistor 132 contacts the second gate insulator 124, and the second gate insulator 124 is positioned between the ballast resistor 132 and the surface of the planar portion 136. The ballast resistor 132 can be any form of resistor and can comprise, for example, a silicide blocking layer (SBLK). The ballast resistor 132 helps distribute the currently uniformly, and avoids the current constriction in a narrow region, thus avoiding device failure at lower currents.

Figure 9:
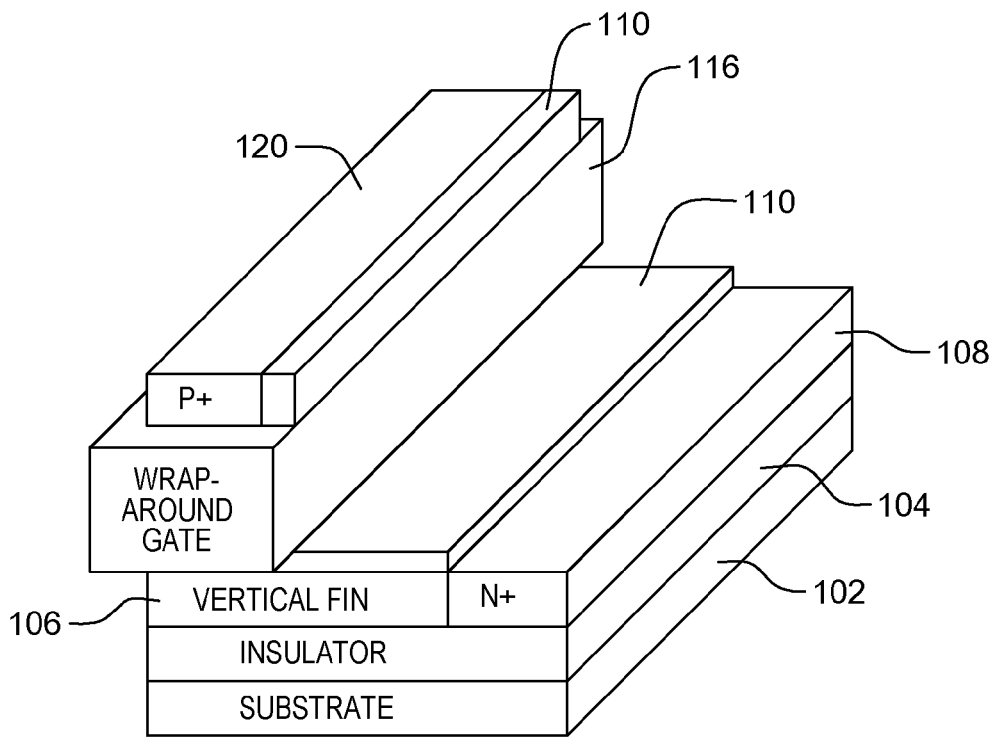
FIG. 9 is a schematic diagram illustrating a field effect diode in perspective view.
Figure 10:
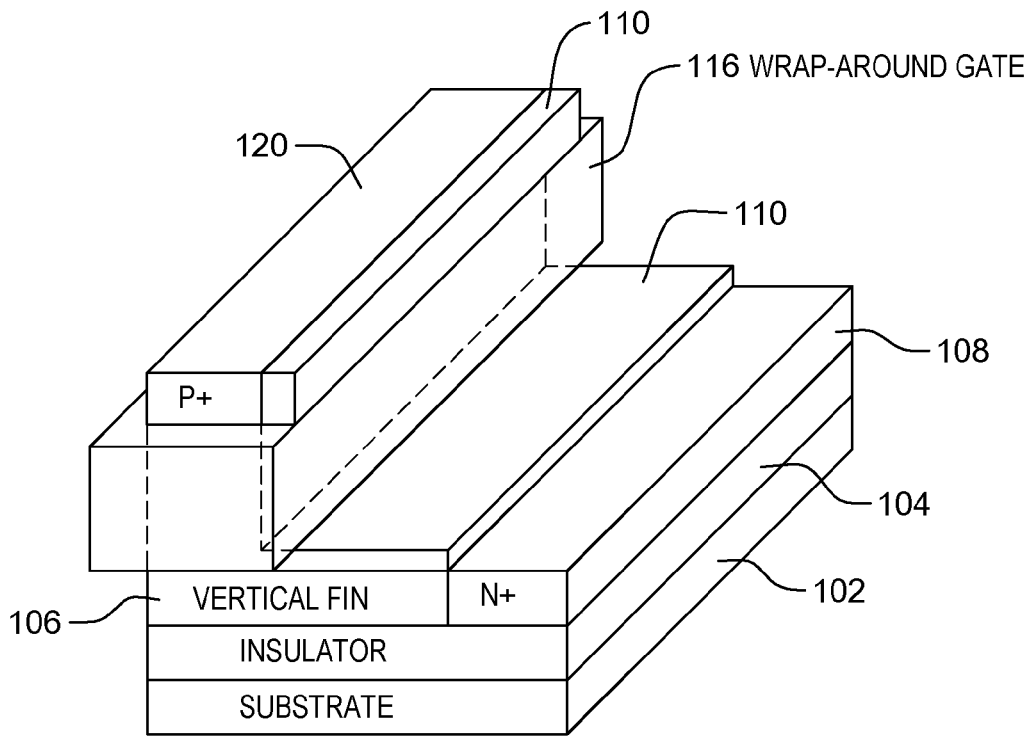
FIG. 10 is a schematic diagram illustrating the field effect diode, shown in FIG. 9, in perspective view showing the wrap-around gate in transparent view.
Figure 11:
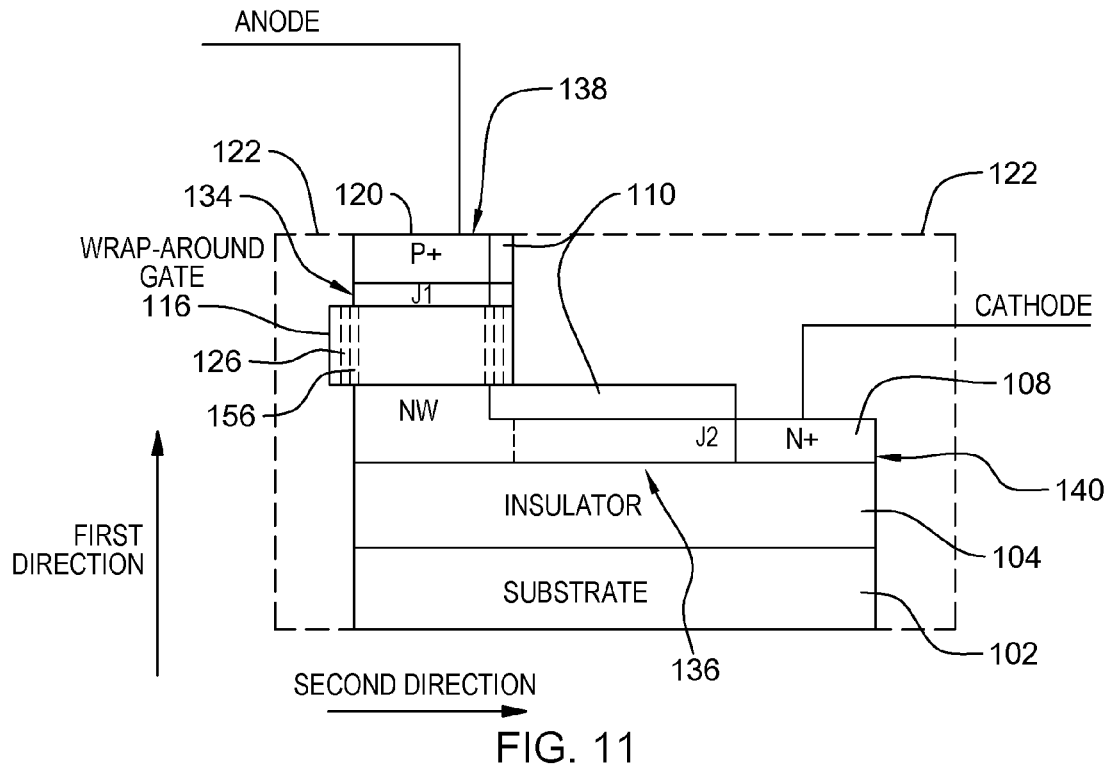
FIG. 11 is a schematic diagram illustrating a field effect diode, shown in FIG. 9, in cross-sectional view.

As shown in FIGS. 9-12 additional structures herein comprise fin-type polysilicon field effect diodes. More specifically, FIG. 9 is a schematic diagram illustrating a field effect diode in perspective view. FIG. 10 is a schematic diagram illustrating the field effect diode, shown in FIG. 9, in perspective view showing the wrap-around gate in transparent view. FIG. 11 is a schematic diagram illustrating a field effect diode, shown in FIG. 9, in cross-sectional view.

Figure 12:
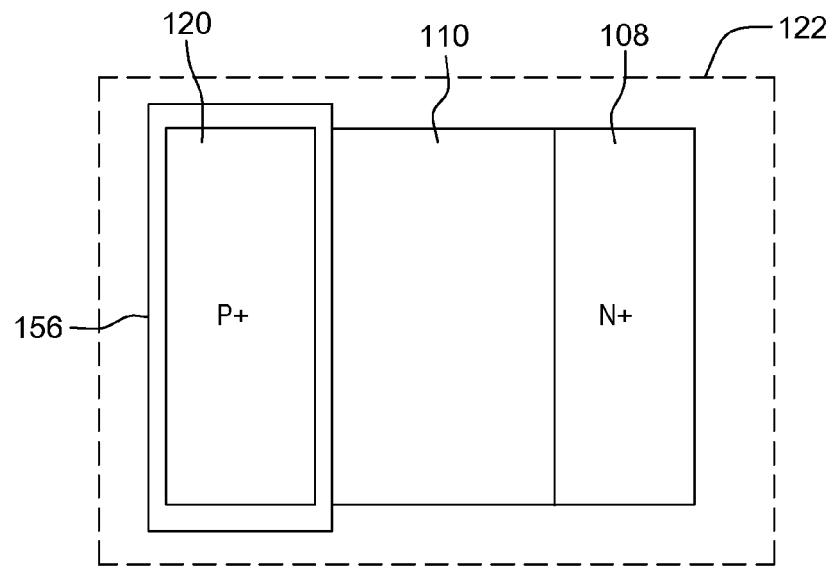
FIG. 12 is a schematic diagram illustrating a field effect diode, shown in FIG. 9, in plan or top-down view.

FIG. 12 is a schematic diagram illustrating a field effect diode, shown in FIG. 9, in plan or top-down view.

Thus, the structure shown in FIGS. 9-12 includes a polysilicon junction structure 156 that is positioned on the vertical fin portion 134, and the rest of the vertical fin portion 134 is the well region (NW). Thus, the polysilicon junction structure 156 is positioned on the vertical fin portion 134. The fin portion 134 again extends in a first direction from the planar portion 136. The fin portion 134 has a top surface 138 distal to the planar portion 136 in the first direction. The top surface 138 is co-planar with the planar portion 136, but the top surface 138 lies in a different plane from the planar portion 136. The planar portion 136 has an end surface 140 distal to the fin portion 134 in the second direction. The end surface 140 is co-planar with the fin portion 134, but the end surface 140 lies in a different plane from the fin portion 134.

An anode 120 is positioned at the top surface 138 of the fin portion 134, and a cathode 108 is positioned at the end surface 140 of the planar portion 136. A gate insulator 126 contacts a surface of the polysilicon junction structure 156. The gate insulator 126 contacts the surface of the polysilicon junction structure 156 between the top surface 138 and the planar portion 136. A gate conductor 116 contacts the gate insulator 126, and the gate insulator 126 is positioned between the gate conductor 116 and the surface of the fin portion 134.

Figure 13:
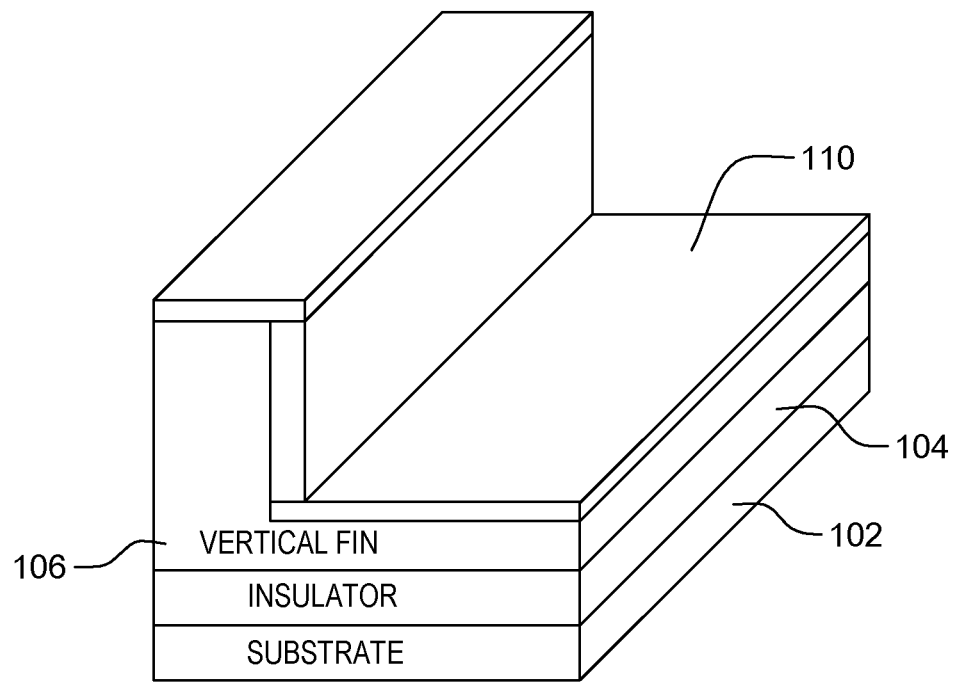
FIG. 13 is a schematic perspective diagram illustrating a partially formed field effect diode.
Figure 14:
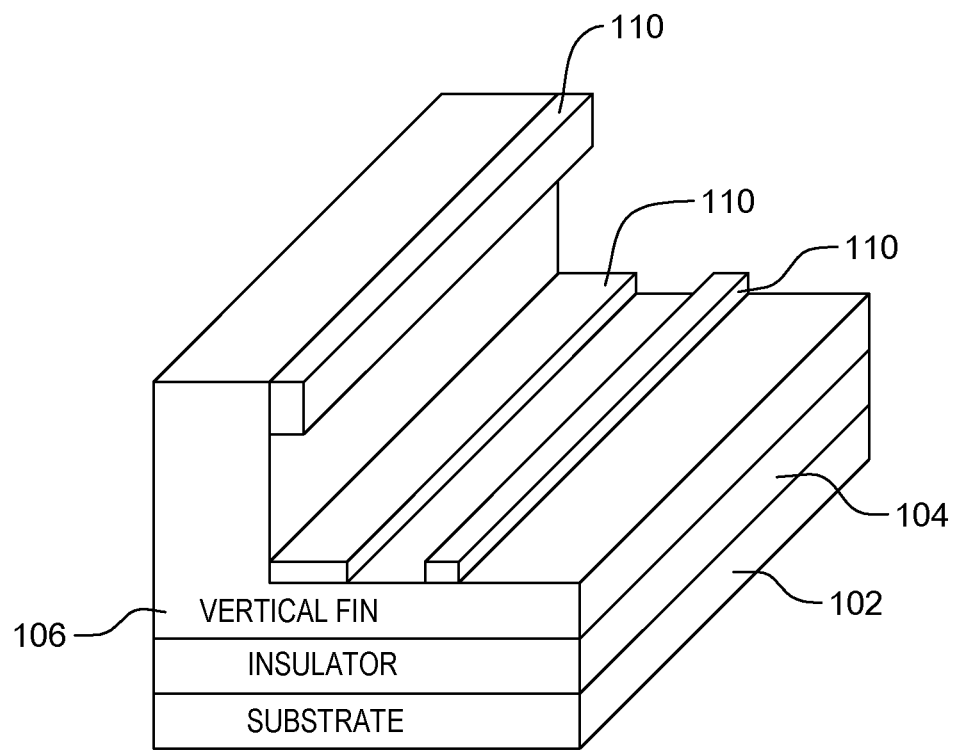
FIG. 14 is a schematic perspective diagram illustrating a partially formed field effect diode.

While the above structures can be formed using many different methods known to those ordinarily skilled in the art, FIGS. 13-22 are presented to illustrate some ways in which the above structures could be manufactured. Specifically, FIGS. 13 and 14 are schematic perspective diagrams illustrating a partially formed field effect diode. In FIG. 13, an insulator layer 104 is formed on a substrate 102 using well-know layer formation and deposition processes. Additionally, using well-known lithographic masking, depositing, patterning, and shaping processes a fin structure 106 is formed. A conformal insulator layer 110 is formed or grown on the fin structure 106. Next, as shown in FIG. 14, the insulator 110 is patterned using well-known lithographic masking, patterning, and shaping processes.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a stack of $SiO_2$ and $Si_3N_4$, and metal oxides like tantalum oxide. The thickness of dielectrics herein may vary contingent upon the required device performance.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a positive resist (illuminated portions remain) or negative resist (illuminated portions are rinsed off). A material removal process is then performed (e.g., plasma etching, etc.) to remove the unprotected portions of the material below the resist to be patterned. The resist is subsequently removed to leave the underlying material patterned according to the light exposure pattern (or a negative image thereof).

Figure 15:
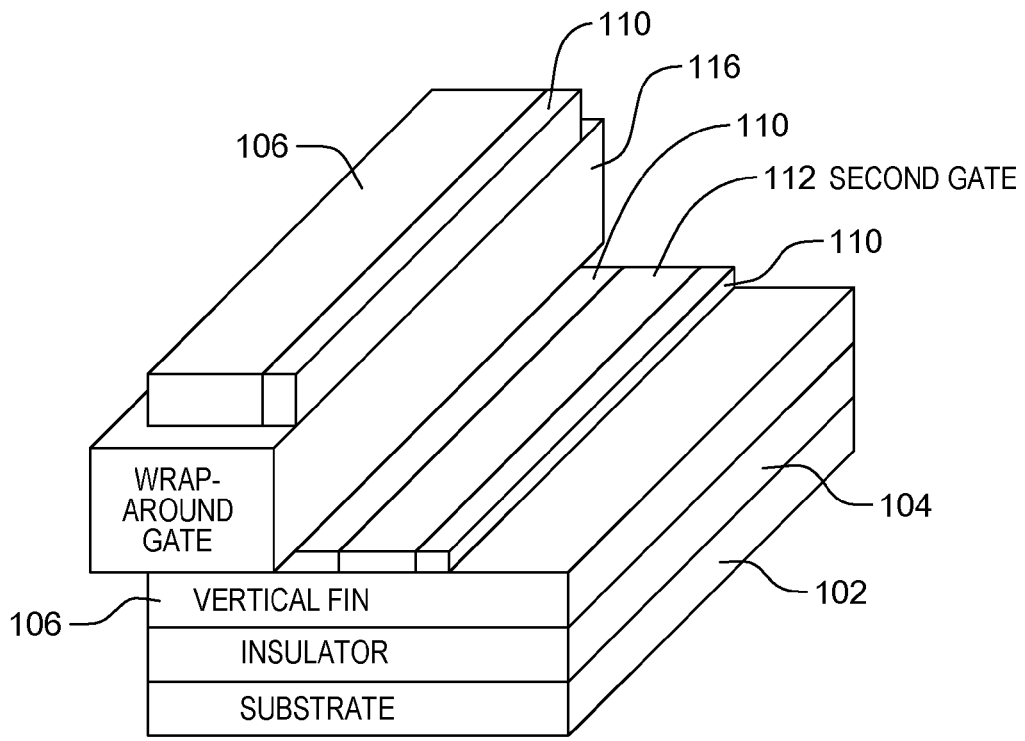
FIG. 15 is a schematic perspective diagram illustrating a partially formed field effect diode that will result in the field effect diode shown in FIGS. 1-4.
Figure 16:
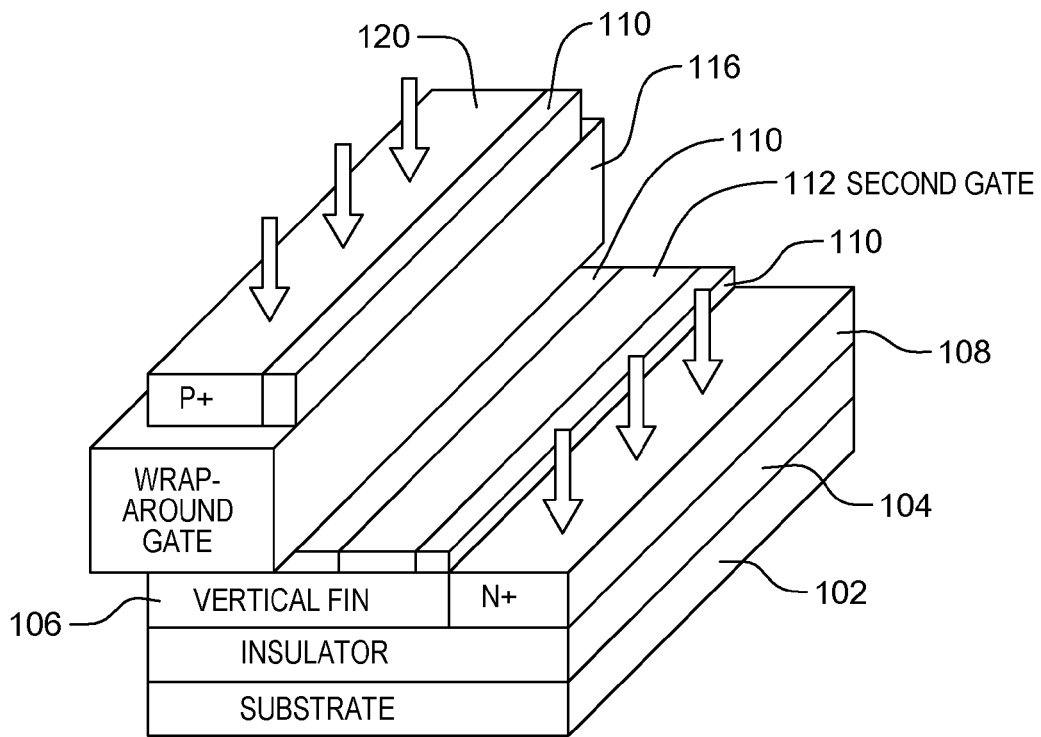
FIG. 16 is a schematic perspective diagram illustrating a partially formed field effect diode that will result in the field effect diode shown in FIGS. 1-4.

FIGS. 15 and 16 are schematic perspective diagrams illustrating a partially formed field effect diode that will result in the field effect diode shown in FIGS. 1-4. More specifically, in FIG. 15, gates 112 and 116 are formed within the patterned insulator 110, again using well-known lithographic masking, depositing, patterning, and shaping processes. In FIG. 16, the anode 120 and cathode 108 are formed through well-known processes that introduce impurities (represented by the arrows) to change the material of the fin structure 106 into anode and cathode material.

Generally, transistor structures are formed by depositing or implanting impurities into a substrate to form at least one semiconductor channel region, bordered by shallow trench isolation regions below the top (upper) surface of the substrate. A "substrate" herein can comprise any material appropriate for the given purpose (whether now known or developed in the future) and can comprise, for example, Si, SiC, SiGe, SiGeC, other III-V or II-VI compound semiconductors, or organic semiconductor structures, etc. Shallow trench isolation (STI) structures are well-known to those ordinarily skilled in the art and are generally formed by patterning openings/trenches within the substrate and growing or filling the openings with a highly insulating material (this allows different active areas of the substrate to be electrically isolated from one another).

A positive-type transistor "P-type material" uses impurities such as boron, aluminum or gallium, etc., within an intrinsic semiconductor substrate (to create deficiencies of valence electrons) as a semiconductor region. Similarly, an "N-type material" is a negative-type transistor that uses impurities such as antimony, arsenic or phosphorous, etc., within an intrinsic semiconductor substrate (to create excessive valence electrons) as a semiconductor region. Further the "+" and "−" designations indicate the relative impurity concentrations.

Figure 17:
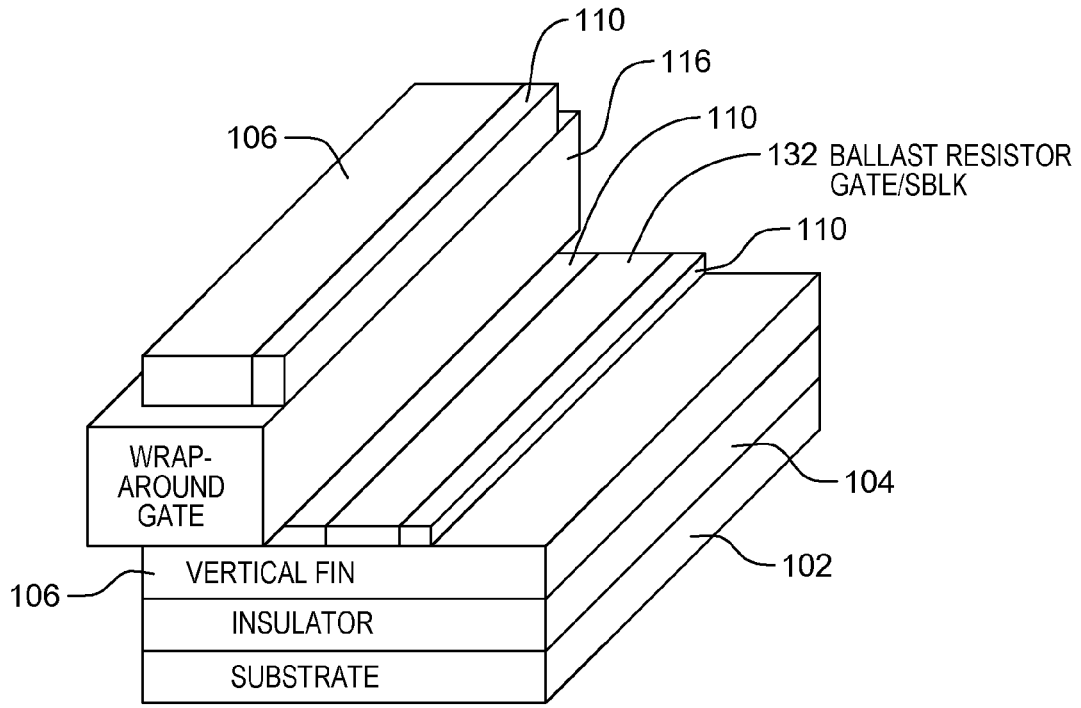
FIG. 17 is a schematic perspective diagram illustrating a partially formed field effect diode that will result in the field effect diode shown in FIGS. 5-8.
Figure 18:
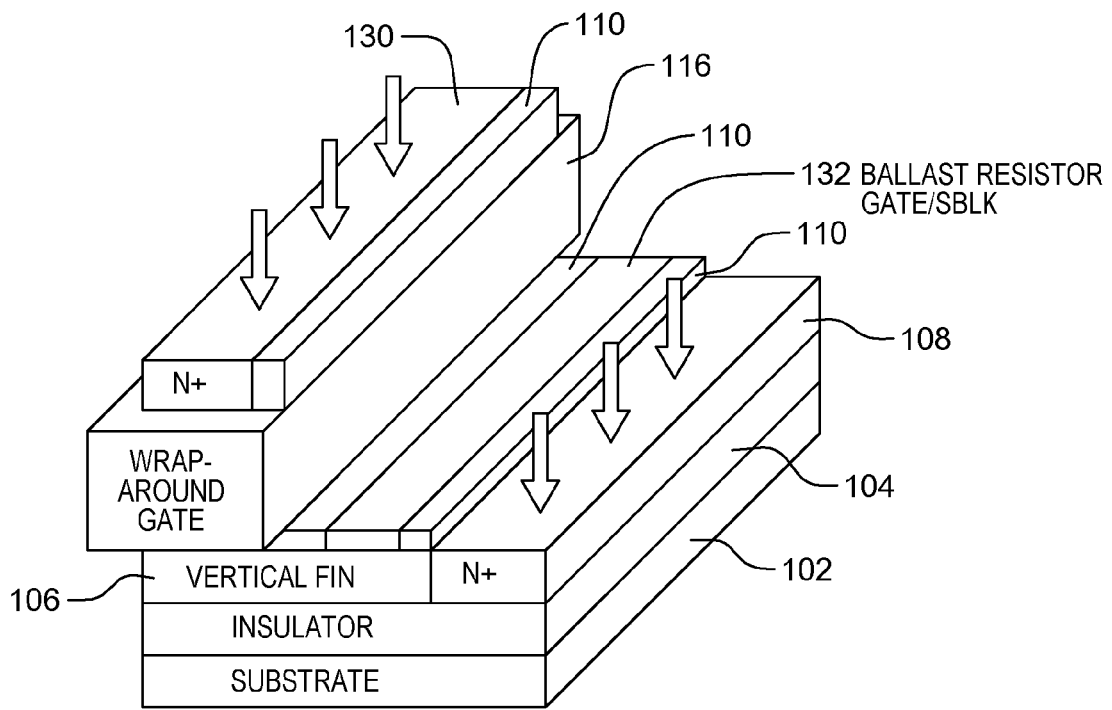
FIG. 18 is a schematic perspective diagram illustrating a partially formed field effect diode that will result in the field effect diode shown in FIGS. 5-8.
Figure 19:
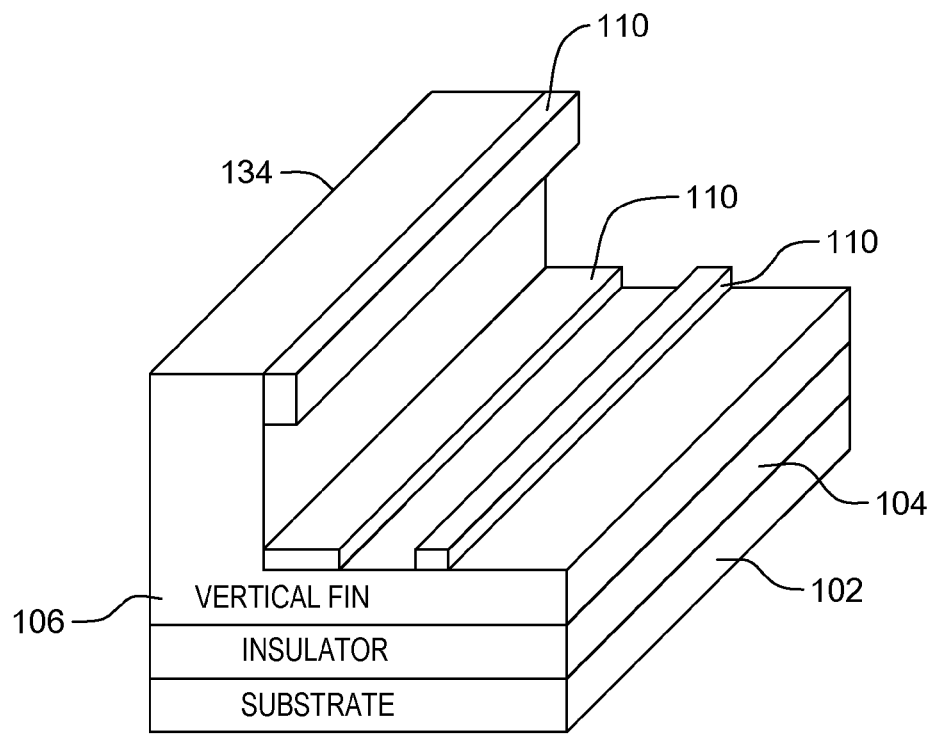
FIG. 19 is a schematic perspective diagram illustrating a partially formed field effect diode that will result in the field effect diode shown in FIGS. 9-12.

FIGS. 17 and 18 are schematic perspective diagrams illustrating a partially formed field effect diode that will result in the field effect diode shown in FIGS. 5-8. Starting again with the structure shown in FIG. 14, now in FIG. 17, ballast resistor/gate 132 and gate 116 are formed within the patterned insulator 110, again using well-known lithographic masking, depositing, patterning, and shaping processes. In FIG. 18, the anode 130 and cathode 108 are formed through well-known processes that introduce impurities (represented by the arrows) to change the material of the fin structure 106 into anode and cathode materials.

Figure 20:
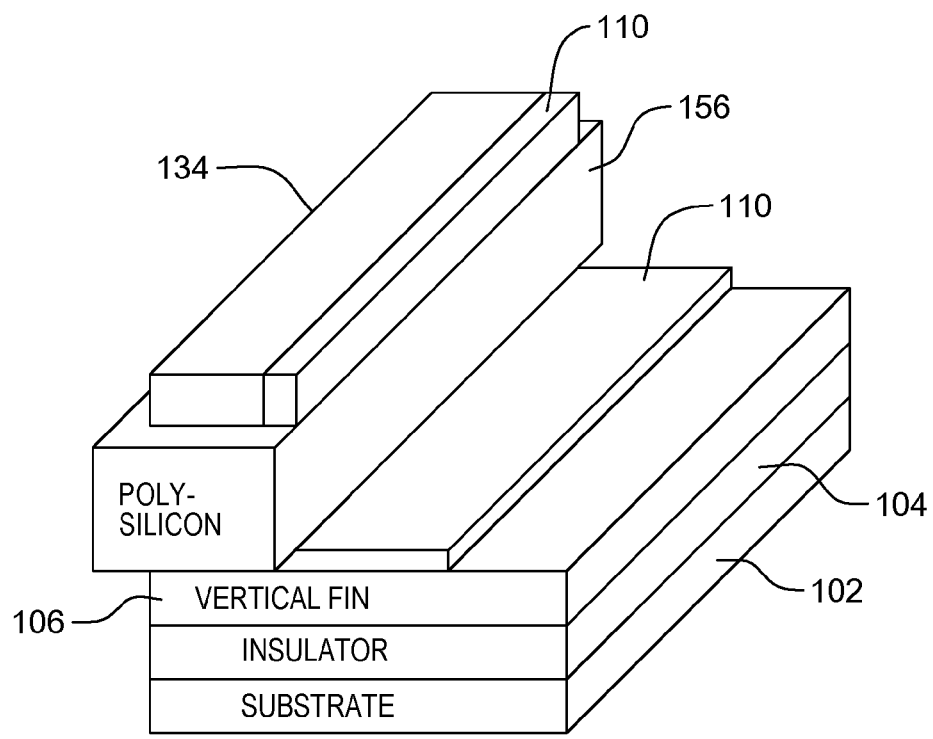
FIG. 20 is a schematic perspective diagram illustrating a partially formed field effect diode that will result in the field effect diode shown in FIGS. 9-12.
Figure 21:
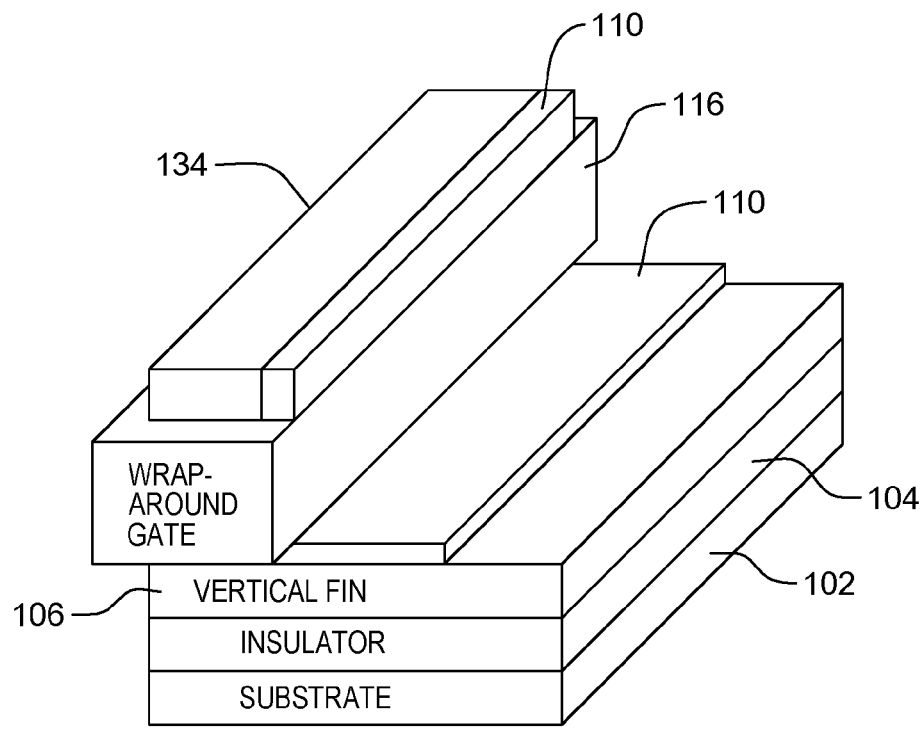
FIG. 21 is a schematic perspective diagram illustrating a partially formed field effect diode that will result in the field effect diode shown in FIGS. 9-12.
Figure 22:
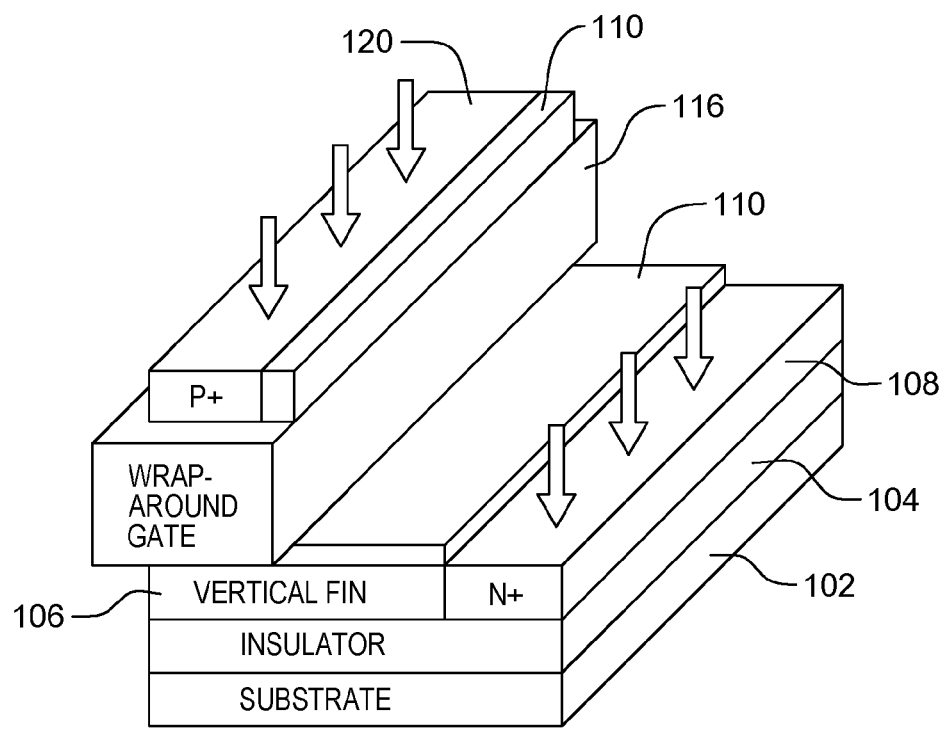
FIG. 22 is a schematic perspective diagram illustrating a partially formed field effect diode that will result in the field effect diode shown in FIGS. 9-12.

FIGS. 19-22 are schematic perspective diagrams illustrating a partially formed field effect diode that will result in the field effect diode shown in FIGS. 9-12. Specifically, in FIG. 19, an insulator layer 104 is formed on a substrate 102 using well-know layer formation and deposition processes. As discussed above, using well-known lithographic masking, depositing, patterning, and shaping processes a fin structure 106 is formed. A conformal insulator layer 110 is formed or grown on the fin structure 106. Also, the insulator 110 is patterned using well-known lithographic masking, patterning, and shaping processes. Next, as shown in FIG. 20, polysilicon 156 is formed on the vertical portion 134 of the fin structure 106. In FIG. 21, and the gate insulator 126 and wrap-around gate 116 are formed within the patterned insulator 110, again using well-known lithographic masking, depositing, patterning, and shaping processes. In FIG. 22, the anode 120 and cathode 108 are formed through well-known processes that introduce impurities (represented by the arrows) to change the material of the fin structure 106 into anode and cathode material.

The foregoing structures can be included within integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Within a gated diode, the semiconductor p-n junction is positioned between a conductive "anode" region and a similarly conductive "cathode" region and when the semiconductor is in a conductive state, the semiconductor allows electrical current to flow in a specific direction between the anode and cathode. A "gate" is a conductive element that is electrically separated from the semiconductor by a "gate oxide" (which is an insulator) and current/voltage within the gate changes the conductivity of the semiconductor region.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A field effect diode comprising:
a junction structure having an L-shape in cross-section, said junction structure comprising a planar portion and a fin portion, said fin portion extending in a first direction from said planar portion, said planar portion extending in a second direction perpendicular to said first direction, said fin portion having a top surface distal to said planar portion in said first direction, said top surface being co-planar with said planar portion, said top surface lying in a different plane from said planar portion, said planar portion having an end surface distal to said fin portion in said second direction, said end surface being co-planar with said fin portion, and said end surface lying in a different plane from said fin portion;
an anode positioned at said top surface of said fin portion;
a cathode positioned at said end surface of said planar portion;
a first gate insulator contacting a surface of said fin portion extending in said first direction, said first gate insulator contacting said surface of said fin portion between said top surface and said planar portion;
a first gate conductor contacting said first gate insulator, said first gate insulator being positioned between said first gate conductor and said surface of said fin portion;
a second gate insulator contacting a surface of said planar portion extending in said second direction, said second gate insulator contacting said surface of said planar portion between said end surface and said fin portion; and
a ballast resistor contacting said second gate insulator, said second gate insulator being positioned between said ballast resistor and said surface of said planar portion.

2. The field effect diode in claim 1, said junction structure comprising a plurality of p-n junctions between said anode and said cathode.

3. The field effect diode in claim 1, said junction structure comprising:
a first temporary p-n junction between said anode and said first gate conductor;
a second temporary p-n junction between said fin portion and said ballast resistor; and
a third permanent p-n junction between said cathode and said ballast resistor.

4. The field effect diode in claim 1, said junction structure comprising a semiconductor, said anode comprising a conductor having a first type impurity, said cathode comprising a conductor having a second type impurity, and said first type impurity having an opposite polarity from said second type impurity.

5. The field effect diode in claim 1, said first gate conductor comprising a wrap-around gate conductor surrounding sides of said fin portion extending in said first direction, and said first gate insulator being between said sides of said fin portion and said wrap-around gate conductor.

6. The field effect diode in claim 1, said ballast resistor comprising an electrostatic discharge protection device.

7. The field effect diode in claim 1, said junction structure comprising a conductor between said anode and said cathode based on a voltage difference between said first gate conductor and said ballast resistor.

8. A field effect diode comprising:
- a junction structure having an L-shape in cross-section, said junction structure comprising a planar portion and a fin portion, said fin portion extending in a first direction from said planar portion, said planar portion extending in a second direction perpendicular to said first direction, said fin portion having a top surface distal to said planar portion in said first direction, said top surface being co-planar with said planar portion, said top surface lying in a different plane from said planar portion, said planar portion having an end surface distal to said fin portion in said second direction, said end surface being co-planar with said fin portion, and said end surface lying in a different plane from said fin portion;
- an anode positioned at said top surface of said fin portion;
- a cathode positioned at said end surface of said planar portion;
- a first gate insulator contacting a surface of said fin portion extending in said first direction, said first gate insulator contacting said surface of said fin portion between said top surface and said planar portion;
- a first gate conductor contacting said first gate insulator, said first gate insulator being positioned between said first gate conductor and said surface of said fin portion;
- a second gate insulator contacting a surface of said planar portion extending in said second direction, said second gate insulator contacting said surface of said planar portion between said end surface and said fin portion; and
- a ballast resistor contacting said second gate insulator, said ballast resistor comprising a silicide blocking layer, and
  said second gate insulator being positioned between said ballast resistor and said surface of said planar portion.

9. The field effect diode in claim 8, said junction structure comprising a plurality of p-n junctions between said anode and said cathode.

10. The field effect diode in claim 8, said junction structure comprising:
- a first temporary p-n junction between said anode and said first gate conductor;
- a second temporary p-n junction between said fin portion and said ballast resistor; and
- a third permanent p-n junction between said cathode and said ballast resistor.

11. The field effect diode in claim 8, said junction structure comprising a semiconductor, said anode comprising a conductor having a first type impurity, said cathode comprising a conductor having a second type impurity, and said first type impurity having an opposite polarity from said second type impurity.

12. The field effect diode in claim 8, said first gate conductor comprising a wrap-around gate conductor surrounding sides of said fin portion extending in said first direction, and said first gate insulator being between said sides of said fin portion and said wrap-around gate conductor.

13. The field effect diode in claim 8, said ballast resistor comprising an electrostatic discharge protection device.

14. The field effect diode in claim 8, said junction structure comprising a conductor between said anode and said cathode based on a voltage difference between said first gate conductor and said ballast resistor.

\* \* \* \* \*

UNITED STATES PATENT AND TRADEMARK OFFICE
CERTIFICATE OF CORRECTION

PATENT NO. : 9,704,852 B2
APPLICATION NO. : 15/140516
DATED : July 11, 2017
INVENTOR(S) : Gauthier, Jr. et al.

Page 1 of 1

It is certified that error appears in the above-identified patent and that said Letters Patent is hereby corrected as shown below:

In the Specification

Column 1, Lines 51 and 54:
Please replace "co-planar with" with "parallel to"

Column 2, Lines 39 and 42:
Please replace "co-planar with" with "parallel to"

Column 3, Lines 2 and 6:
Please replace "co-planar with" with "parallel to"

Column 4, Line 67:
Please replace "co-planar with" with "parallel to"

Column 5, Line 4:
Please replace "co-planar with" with "parallel to"

Column 6, Lines 30 and 34:
Please replace "co-planar with" with "parallel to"

Column 7, Lines 11 and 15:
Please replace "co-planar with" with "parallel to"

In the Claims

Claim 1, Column 10, Lines 22 and 26:
Please replace "co-planar with" with "parallel to"

Claim 8, Column 11, Lines 18 and 22:
Please replace "co-planar with" with "parallel to"

Signed and Sealed this
Second Day of July, 2019

Andrei Iancu
*Director of the United States Patent and Trademark Office*